(12) United States Patent
Theuss et al.

(10) Patent No.: US 11,686,667 B2
(45) Date of Patent: Jun. 27, 2023

(54) PHOTOACOUSTIC SENSORS AND ASSOCIATED PRODUCTION METHODS

(71) Applicant: Infineon Technologies AG, Neubiberg (DE)

(72) Inventors: Horst Theuss, Wenzenbach (DE); Rainer Markus Schaller, Donau (DE)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 17/407,803

(22) Filed: Aug. 20, 2021

(65) Prior Publication Data

US 2022/0065773 A1    Mar. 3, 2022

(30) Foreign Application Priority Data

Sep. 1, 2020 (DE) .......................... 102020122812.0

(51) Int. Cl.
*G01N 21/17* (2006.01)
*G01N 29/24* (2006.01)
*B81B 7/02* (2006.01)

(52) U.S. Cl.
CPC ........... *G01N 21/1702* (2013.01); *B81B 7/02* (2013.01); *G01N 29/2425* (2013.01); *B81B 2201/0264* (2013.01); *B81B 2201/04* (2013.01); *B81B 2203/0315* (2013.01); *G01N 2021/1704* (2013.01)

(58) Field of Classification Search
CPC ........... G01N 21/1702; G01N 21/0303; G01N 29/022; G01N 29/2425; G01N 29/2418; G01N 29/30; G01N 2021/1704; G01N 2291/0256; G01N 2291/0215; B81B 7/02; B81B 2201/0264; B81B 2201/04; B81B 2203/0315; B01J 19/0093; B01L 3/5027; G01D 11/30

See application file for complete search history.

(56) References Cited

U.S. PATENT DOCUMENTS

| | | | |
|---|---|---|---|
| 2015/0101395 A1* | 4/2015 | Dehe .................. | G01N 21/1702 73/24.02 |
| 2017/0067859 A1* | 3/2017 | Kolb ..................... | G01N 29/30 |
| 2020/0057031 A1 | 2/2020 | Theuss et al. | |
| 2020/0355602 A1* | 11/2020 | Kolb .................. | G01N 21/1702 |
| 2022/0155261 A1* | 5/2022 | Kolb .................. | G01N 29/2418 |

FOREIGN PATENT DOCUMENTS

| | | |
|---|---|---|
| DE | 102016205024 A1 | 9/2016 |
| DE | 102018120061 A1 | 2/2020 |

* cited by examiner

*Primary Examiner* — Suman K Nath
(74) *Attorney, Agent, or Firm* — Slater Matsil, LLP

(57) ABSTRACT

A photoacoustic sensor includes a first layer with an optical MEMS emitter; a second layer stacked over the first layer with a MEMS pressure pick-up and an optically transparent window, wherein the MEMS pressure pick-up and the optically transparent window are offset laterally with respect to one another; and a third layer stacked over the second layer with a cavity for a reference gas. The optical MEMS emitter transmits optical radiation along an optical path, wherein the optical path runs through the optically transparent window and the cavity for the reference gas, and wherein the MEMS pressure pick-up is outside the course of the optical path.

25 Claims, 6 Drawing Sheets

PHOTOACOUSTIC SENSORS AND ASSOCIATED PRODUCTION METHODS

This application claims the benefit of German Patent Application No. 102020122812.0, filed on Sep. 1, 2020, which application is hereby incorporated herein by reference.

TECHNICAL FIELD

The present disclosure relates to photoacoustic sensors and methods for producing photoacoustic sensors.

BACKGROUND

Photoacoustic sensors can be designed for example to detect specific gas species in the ambient air. In particular, harmful or hazardous components in the ambient air can be detected in this case. The correct functioning of such photoacoustic sensors can thus be of high importance in many applications, particularly if the photoacoustic sensors are intended to guarantee the safety of work personnel. Manufacturers of photoacoustic sensors constantly endeavor to improve their products. In particular, it may be desirable in this case to provide cost-effective photoacoustic sensors with an improved construction. Furthermore, it may be desirable to provide improved methods for producing such photoacoustic sensors.

SUMMARY

Various aspects relate to a photoacoustic sensor. The photoacoustic sensor comprises a first layer with an optical MEMS emitter; a second layer stacked over the first layer with a MEMS pressure pick-up and an optically transparent window, wherein the MEMS pressure pick-up and the optically transparent window are arranged offset laterally with respect to one another; and a third layer stacked over the second layer with a cavity for a reference gas. The optical MEMS emitter is designed to transmit optical radiation along an optical path, wherein the optical path runs through the optically transparent window and the cavity for the reference gas, and wherein the MEMS pressure pick-up is arranged outside the course of the optical path.

Various aspects relate to a photoacoustic sensor. The photoacoustic sensor comprises an emitter component, comprising a first layer with an optical MEMS emitter, and a cover arranged over the first layer. The photoacoustic sensor furthermore comprises a pressure pick-up component separate from the emitter component, comprising a second layer with a MEMS pressure pick-up and an optically transparent window, wherein the MEMS pressure pick-up and the optically transparent window are arranged offset laterally with respect to one another, and a third layer stacked over the second layer with a cavity for a reference gas. The optical MEMS emitter is designed to transmit optical radiation along an optical path, wherein the optical path runs through the optically transparent window and the cavity for the reference gas, and wherein the MEMS pressure pick-up is arranged outside the course of the optical path.

Various aspects relate to a method for producing a photoacoustic sensor. The method comprises providing a first layer with an optical MEMS emitter, stacking a second layer with a MEMS pressure pick-up and an optically transparent window over the first layer, wherein the MEMS pressure pick-up and the optically transparent window are arranged offset laterally with respect to one another, and stacking a third layer with a cavity for a reference gas over the second layer. The optical MEMS emitter is designed to transmit optical radiation along an optical path, wherein the optical path runs through the optically transparent window and the cavity, and wherein the MEMS pressure pick-up is arranged outside the course of the optical path.

BRIEF DESCRIPTION OF THE DRAWINGS

Devices and methods in accordance with the disclosure are explained in greater detail below with reference to drawings. The elements shown in the drawings are not necessarily rendered in a manner true to scale relative to one another. Identical reference signs may designate identical components.

FIGS. 1B to 1E illustrate plan views of parts of the photoacoustic sensor;

DETAILED DESCRIPTION OF ILLUSTRATIVE EMBODIMENTS

Figure 1A:
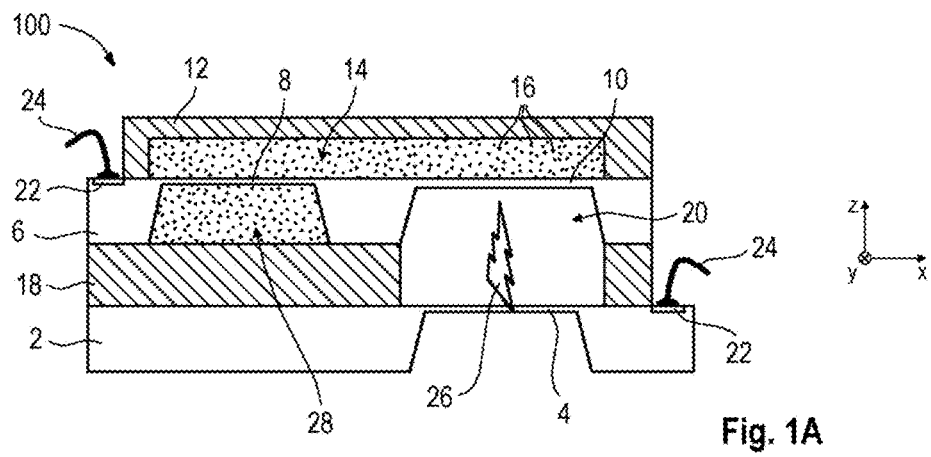
FIGS. 1A to 1E schematically illustrates a cross-sectional side view of a photoacoustic sensor in accordance with the disclosure.

The figures described below show devices and methods in accordance with the disclosure. In this case, the devices and methods described may be presented in a general way in order to qualitatively describe aspects of the disclosure. The devices and methods described may have further aspects that may not be illustrated in the respective figure for the sake of simplicity. However, the respective example can be extended by aspects described in connection with other examples in accordance with the disclosure. Explanations concerning a specific figure may thus equally apply to examples in other figures.

The photoacoustic sensor (or photoacoustic gas sensor) 100 in FIG. 1A through FIG. 1E can comprise a first layer 2 with an optical MEMS emitter 4. A second layer 6 with a MEMS pressure pick-up 8 and an optically transparent window 10 can be stacked over the first layer 2. Furthermore, a third layer 12 with a cavity 14 for a reference gas 16 can be stacked over the second layer 6. In the example in FIG. 1A through FIG. 1E, the photoacoustic sensor 100 can optionally comprise a spacer layer 18 arranged between the first layer 2 and the second layer 6. An opening 20 can be formed in the second layer 6 and the spacer layer 18.

Figure 1B:
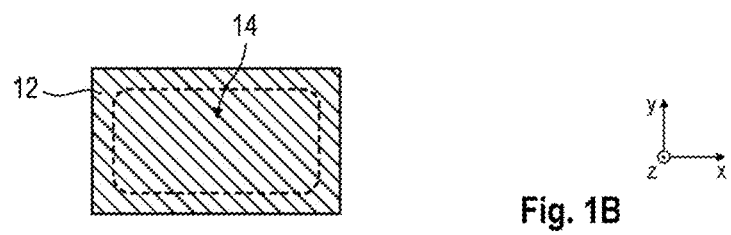
Figure 1C:
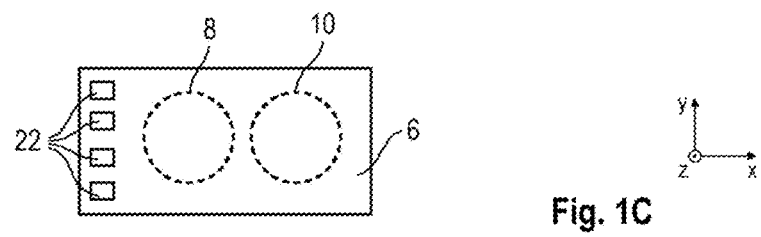

The first layer 2 can be fabricated for example from a semiconductor material, in particular silicon. In this case, a thickness of the first layer 2 in the z-direction can be for example in a range of approximately 350 micrometers to approximately 450 micrometers. The optical MEMS emitter 4 can be integrated into the first layer 2 or the semiconductor material thereof. The first layer 2 can thus also be referred to as semiconductor chip or MEMS semiconductor chip. In one example, the optical MEMS emitter 4 can comprise a movable MEMS structure, which can be embodied for example in the form of a heating membrane for generating optical radiation 26. FIG. 1E shows a plan view of the first layer 2. It is evident from FIG. 1E that the optical MEMS emitter 4 or its movable structure can have a circular shape by way of example. In further examples, this shape can be chosen differently, for example oval, rectangular or square, etc.

The first layer 2 can be regarded as a photoacoustic emitter unit of the photoacoustic sensor 100. In this case, the optical MEMS emitter 4 can be a broadband emitter, in particular, which can be designed to emit the optical radiation 26 over a broad frequency range. In other words, the radiation 26 emitted by the broadband emitter can have not just predetermined frequencies or predetermined frequency bands.

The terms "optically" and "optical radiation" used in this description can generally refer to a partial range of the electromagnetic spectrum having wavelengths of between approximately 100 nm and approximately 100 µm. That is to say that the optical radiation 26 can comprise in particular at least one from the following: ultraviolet (UV) radiation having a wavelength of approximately 100 nm to approximately 380 nm, infrared (IR) radiation having a wavelength of approximately 780 nm to approximately 100 µm, or radiation having a wavelength of approximately 780 nm to approximately 5 µm, i.e. near infrared radiation and portions of mid-infrared radiation. The last-mentioned range can comprise inter alia the absorption lines/bands of carbon dioxide at 4.26 µm and of further gas species. Even more specifically, the optical radiation 26 can have a wavelength of approximately 300 nm to approximately 20 m.

The optical MEMS emitter 4 can be designed to emit optical pulses having a predetermined repetition frequency and one or more predetermined wavelengths. In this case, a predetermined wavelength can comprise an absorption band of a gas to be detected or of the reference gas 16. The repetition frequency of the optical pulses can be within a low-frequency range or within a frequency range of approximately 1 Hz to approximately 10 kHz, in particular of approximately 1 Hz to approximately 1 kHz. Even more specifically, a typical frequency range can be between approximately 1 Hz and approximately 100 Hz, corresponding to a pulse duration range of approximately 0.01 s to approximately 1 s.

The first layer 2 can optionally have further electronic components, which can be integrated into a semiconductor material of the first layer 2. In one example, the first layer 2 can have a logic circuit (not shown), which can be designed logically to process signals detected by the MEMS pressure pick-up 8 and/or to control the optical MEMS emitter 4. The logic circuit can be designed for example for one or more from a control function, signal processing, digitization, signal amplification, etc. By way of example, the logic circuit can be embodied in the form of an ASIC (Application Specific Integrated Circuit).

The first layer 2 can have one or more electrical terminals 22, which can be arranged for example on the top side of the first layer 2. In the plan view in FIG. 1E, the first layer 2 can have four electrical terminals 22 by way of example. The electrical terminals 22 can be contacted for example by one or more electrical connection elements 24. In FIG. 1A, the electrical connection element 24 is represented by a bond wire by way of example. The optical MEMS emitter 4 or its movable structure can be electrically contacted and for example controlled by further, in particular external, components (not shown) byway of the electrical connection element 24 and the electrical terminal 22.

The second layer 6 can be fabricated for example from a semiconductor material, in particular silicon. In this case, a thickness of the second layer 6 in the z-direction can be in a range of approximately 350 micrometers to approximately 450 micrometers. The MEMS pressure pick-up 8 or one or more movable MEMS structures of the MEMS pressure pick-up 8 can be integrated into the second layer 6 or the semiconductor material thereof. The second layer 6 can thus be referred to as semiconductor chip or MEMS semiconductor chip. The MEMS pressure pick-ups specified in this description can be for example microphones or any other type of pressure sensors or pressure-sensitive sensors, which can be based for example on a piezoelectric sensor technology and/or a capacitive sensor technology. FIG. 1C shows a plan view of the second layer 6. It is evident from FIG. 1C that the MEMS pressure pick-up 8 or its movable structure can have a circular shape byway of example. In further examples, this shape can be chosen differently, for example oval, rectangular, square, etc. The second layer 6 can be regarded as a photoacoustic detector unit of the photoacoustic sensor 100.

In a manner similar to the first layer 2, the second layer 6 can have one or more electrical terminals 22, which can be arranged for example on the top side of the second layer 6. In the plan view in FIG. 1C, the second layer 6 can have four electrical terminals 22 by way of example. The electrical terminals 22 can be contacted for example by one or more electrical connection elements 24. In the example in FIG. 1A, the electrical connection element 24 is represented by a bond wire by way of example. Signals detected by the MEMS pressure pick-up 8 or its movable structure can be transmitted to further, in particular external, components (not shown) by way of the electrical terminal 22 and the electrical connection element 24.

The MEMS pressure pick-up 8 and the optically transparent window 10 can be arranged offset laterally, i.e. in the x-direction and/or in the y-direction, with respect to one another. In one example, the optically transparent window 10 can be fabricated from the semiconductor material of the second layer 6. In this case, a thickness of the optically transparent window 10 in the z-direction can be for example in a range of approximately 100 micrometers to approximately 200 micrometers. It is evident from the plan view in FIG. 1C that the optically transparent window 10 can have a circular shape by way of example. In further examples, the shape can be chosen differently, for example oval, rectangular, square, etc. The optically transparent window 10 can be designed to allow passage of at least one portion of the optical radiation 26. It should be noted in this context that a silicon material can be at least partly IR-transparent, i.e. transmissive for IR radiation.

In one example, the optically transparent window 10 can have a bandpass filter structure (not shown), which can be designed to allow passage of at least optical radiation having a wavelength of an absorption band and/or an absorption line of the reference gas 16. In one example, a bandpass filter structure can be provided by vapor deposition of the optically transparent window 10 with one or more $\lambda/4$ layers one over another. In this case, the $\lambda/4$ layers can be fabricated using silicon nitride and/or polysilicon, for example. In a further example, the optically transparent window 10 can have an antireflection coating (not shown), which can be designed to suppress a reflection of the optical radiation 26 that can be provided by the optical MEMS emitter 4. A transmission of the optically transparent window 10 can be increased by the antireflection coating.

That section of the opening 20 which is formed in the second layer 6 can form a gas channel to surroundings (or ambient air) of the photoacoustic sensor 100. In particular, a connection to a gas to be detected that is situated in the surroundings can be provided by the gas channel. In the example in FIG. 1A, the opening 20 can be arranged below the optically transparent window 10 and extend inter alia in the y-direction, for example.

The third layer 12 can be fabricated from at least one from a semiconductor material (in particular silicon) or a glass material. The second layer 6 and the third layer 12 can be wafer bonded, i.e. a connection of the two layers may have been carried out at the wafer level. In this case, the cavity 14 for the reference gas 16 can be formed in hermetically sealed fashion. FIG. 1B shows a plan view of the third layer 12. It is evident from FIG. 1B that the cavity 14 can have a substantially rectangular shape by way of example. In further examples, the shape can be chosen differently, for example circular, oval, square, etc. The cavity 14 with the reference gas 16 situated therein can be referred to as reference cell of the photoacoustic sensor 100. The reference gases 16 specified in this description can be for example carbon dioxide, nitrogen oxide, methane, ammonia, etc.

A manner of functioning of the photoacoustic sensor 100 is described below. The further photoacoustic sensors in accordance with the disclosure as described herein can be operated in a similar manner.

The optical MEMS emitter 4 can transmit the optical radiation 26 along an optical path, which can run substantially rectilinearly through the opening 20 in the spacer layer 18 and the second layer 6, through the optically transparent window 10 and through the reference gas 16. The optical pulses 26 emitted by the optical MEMS emitter 4 can thus pass through the interspace formed by the opening 20, which interspace can be filled with ambient air, for example. During propagation through the opening 20, the optical pulses 26 can be at least partly absorbed by portions of a gas to be detected if such a gas is present in the opening 20 (i.e. in the ambient air). The absorption can be specific to the gas to be detected, e.g. characteristic rotation or oscillation modes of atoms or molecules of the gas to be detected.

The optical pulses 26 can enter through the optically transparent material of the window 10 into the cavity 14 of the third layer 12 and impinge there on atoms or molecules of the reference gas 16. In this case, the reference gas 16 can correspond to the gas to be detected. The optical pulses 26 can be at least partly absorbed by the reference gas 16 and cause local pressure increases in the reference gas 16. These pressure increases can be detected by the MEMS pressure pick-up 8 or a movable structure of the MEMS pressure pick-up 8. The signals detected by the MEMS pressure pick-up 8 can be logically processed by one or more circuits (not illustrated), as already explained further above.

If no portions of the gas to be detected are present in the opening 20 or in the ambient air, the optical pulses 26 emitted by the optical MEMS emitter 4 are only absorbed by the reference gas 16 and the MEMS pressure pick-up 8 will detect a periodic measurement signal with the repetition frequency of the optical pulses 26 and a first amplitude. If, in contrast thereto, portions of the gas to be detected are present in the opening 20, the optical radiation 26 can additionally be absorbed by these portions. The MEMS pressure pick-up 8 will then output a periodic measurement signal with a second amplitude, which can be smaller than the first amplitude. On the basis of the magnitudes and profiles of the first and second amplitudes, it is possible to determine a presence and/or a concentration of the gas to be detected in the ambient air. If the concentration of the gas to be detected exceeds a predetermined threshold value, a signal, in particular a warning signal, can be output by the photoacoustic sensor 100 or a device connected thereto.

Figure 1D:
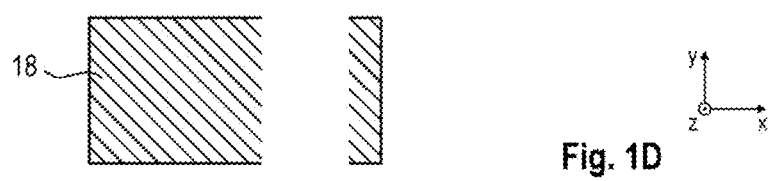
Figure 1E:
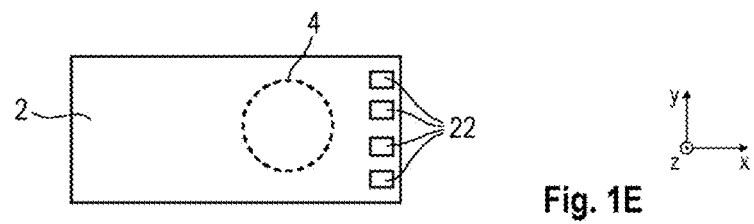

In the example in FIG. 1A through FIG. 1E, the photoacoustic sensor 100 can optionally comprise the spacer layer 18 arranged between the first layer 2 and the second layer 6. In this case, in particular, the spacer layer 18 and the second layer 6 can be wafer bonded. In this case, a cavity 28 for the reference gas 16, said cavity being situated below the movable structure of the MEMS pressure pick-up 8, can be formed in hermetically sealed fashion. The spacer layer 18 can be fabricated from at least one from a semiconductor material (in particular silicon) or a glass material and can form a section of the opening 20. FIG. 1D shows a plan view of the spacer layer 18. It is evident from FIG. 1D that the section of the opening 20 can have a substantially rectangular shape, for example. In particular, the opening sections of the second layer 6 and of the spacer layer 18 can terminate flush with one another.

The opening section of the spacer layer 18 can form a part of the gas channel to the surroundings (or ambient air) of the photoacoustic sensor 100. A connection to a gas to be detected that is situated in the surroundings can be provided by the gas channel. A dimensioning of the opening 20 in the z-direction, i.e. in the direction of the optical path, can be enlarged by means of an additional use of the spacer layer 18. By this means, an increase in the absorption length can be provided, i.e. the optical radiation 26 can be absorbed in an improved manner on account of a lengthened propagation path through a gas to be detected that is situated in the opening 20.

The technical effects described below can be provided by the photoacoustic sensor 100. The same applies to the further photoacoustic sensors in accordance with the disclosure as described herein.

The optical radiation 26 can be transmitted along the optical path described above and in the process can impinge directly on the reference gas 16. As a result of the lateral offset of the MEMS pressure pick-up 8 and optically transparent window 10, the MEMS pressure pick-up 8 can be arranged outside the course of the optical path, i.e. the optical radiation 26 cannot impinge on the movable structures of the MEMS pressure pick-up 8. Undesired thermoacoustic disturbance effects that can corrupt detection by the MEMS pressure pick-up 8 can be avoided or at least reduced by this means. Such thermoacoustic effects can generate in particular an additional pressure pulse on account of absorption effects (in conjunction with heating) in the walls of the reference cell.

If the MEMS pressure pick-up 8 is arranged between two silicon layers 12 and 18, it is only possible for just little IR absorption of the IR radiation in the reference volume to occur, since the silicon used has a high transparency to the IR radiation. The undesired thermoacoustic disturbance effects mentioned can be avoided or at least reduced by this means, too.

During the production of the photoacoustic sensor 100, it is possible to carry out a process of connecting the layers 2, 6, 12 and (optionally) 18 at the wafer level. That means that at least one of the layers 2, 6, 12 and 18 can initially be present in the form of a wafer during the production of the photoacoustic sensor 100. By way of example, the layer or the cover 12 can initially be part of a glass wafer or silicon wafer that can comprise an arbitrary number of further covers. The wafers can be connected to one another using a wafer bonding technique. Afterward, the bonded wafers can be singulated into a plurality of photoacoustic sensors 100. Producing the photoacoustic sensor 100 at the wafer level using a wafer bonding technique can be more cost-effective in comparison with other production methods.

The layers of the singulated photoacoustic sensor 100 can thus be wafer bonded, i.e. the connections between the respective layers can be present in the form of so-called wafer bonds. Depending on the material of the layers bonded to one another, different wafer bonding techniques can be used in this case. One example can involve wafer bonding without the use of an intermediate layer. This can involve in particular direct bonding or anodic bonding. A further example can involve wafer bonding using an intermediate layer. This can involve in particular glass frit bonding, soldering, eutectic bonding, thermocompression bonding, or adhesive bonding. Adhesive bonding can be carried out for example using an adhesive and/or a die attach film (DAF).

Figure 2:
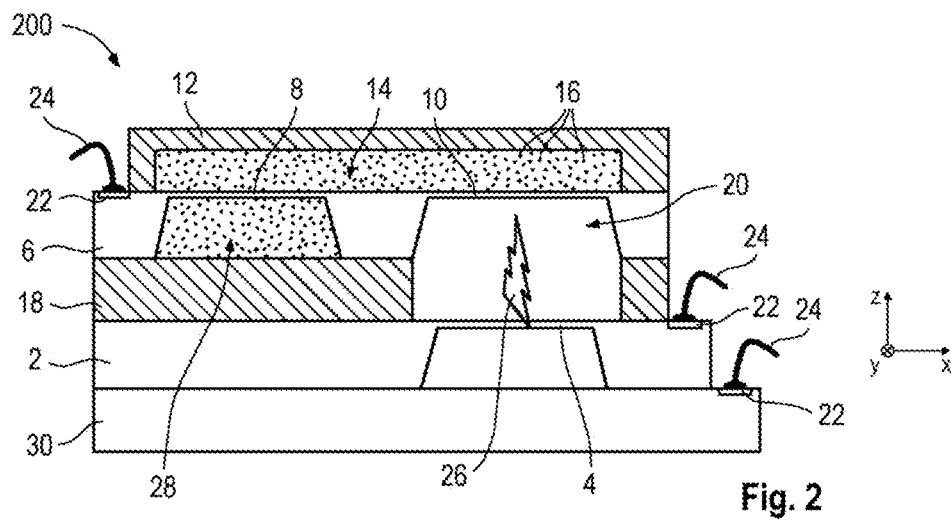
FIG. 2 schematically illustrates a cross-sectional side view of a photoacoustic sensor in accordance with the disclosure, according to another embodiment.

The photoacoustic sensor 200 in FIG. 2 can be at least partly similar to the photoacoustic sensor 100 in FIG. 1A through FIG. 1E. In contrast to FIG. 1A through FIG. 1E, the photoacoustic sensor 200 can additionally comprise a further layer 30, which can be stacked below the first layer 2. The additional layer 30 can be fabricated from at least one from a semiconductor material or a glass material. In one example, the layer 30 can comprise a logic circuit, which can be designed for example logically to process signals detected by the MEMS pressure pick-up 8 and/or to control the optical MEMS emitter 4. In this context and analogously to the further layers of the photoacoustic sensor 200, the additional layer 30 can for example be produced from an ASIC wafer or correspond to a singulated part thereof. In a further example, the layer 30 need not necessarily have an electrical function, but rather can be designed for example to protect the optical MEMS emitter 4. Analogously to the layers 2 and 12 in FIG. 1A through FIG. 1E, the layer 30 can be electrically contacted by way of one or more electrical terminals 22 and electrical connection elements 24.

Figure 3:
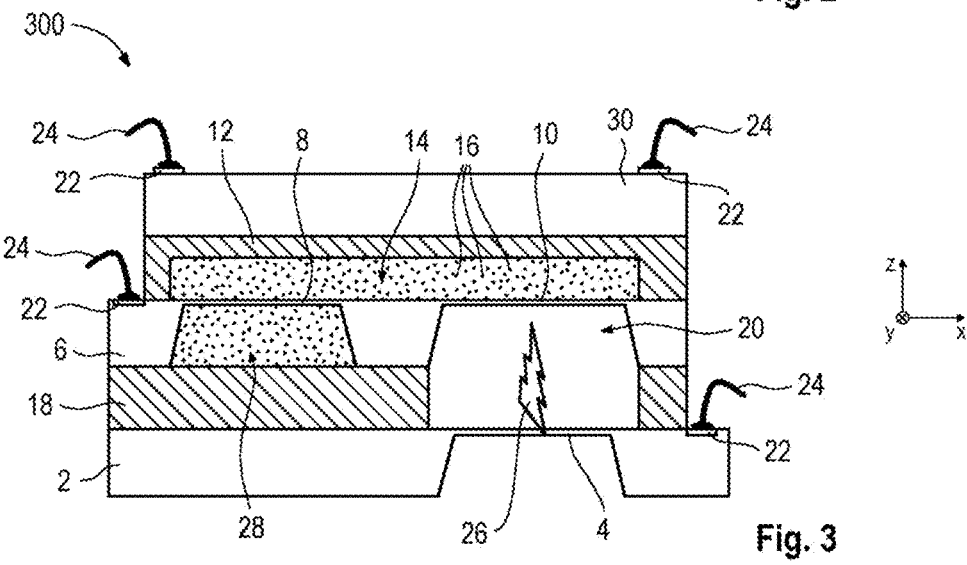
FIG. 3 schematically illustrates a cross-sectional side view of a photoacoustic sensor in accordance with the disclosure, according to another embodiment.

The photoacoustic sensor 300 in FIG. 3 can be at least partly similar to the photoacoustic sensors described above, for example to the photoacoustic sensor 200 in FIG. 2. In contrast to FIG. 2, the layer 30 in FIG. 3 can be stacked over the layer 12. The layers 30 in FIGS. 2 and 3 can have similar functionalities. Analogously to FIG. 2, the layer 30 can be electrically contacted by way of one or more electrical terminals 22 and electrical connection elements 24.

Figure 4:
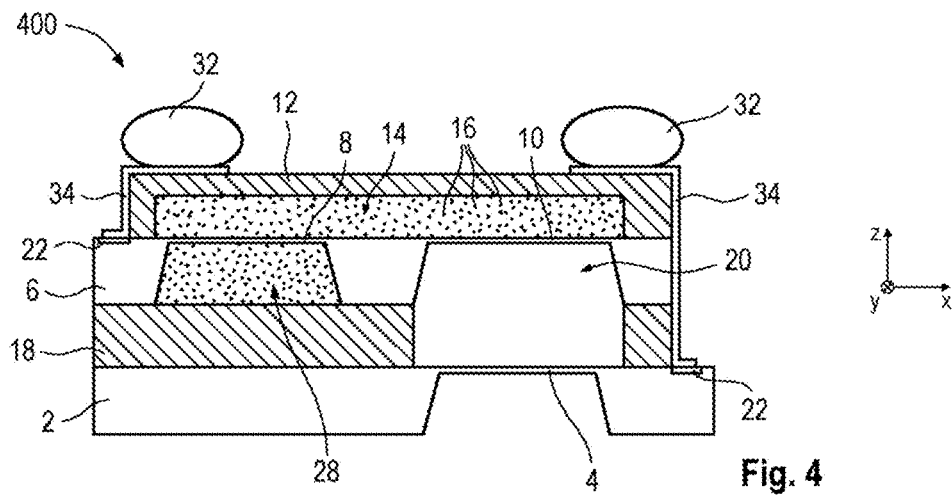
FIG. 4 schematically illustrates a cross-sectional side view of a photoacoustic sensor in accordance with the disclosure, according to another embodiment.

The photoacoustic sensor 400 in FIG. 4 can be at least partly similar to the photoacoustic sensors described above, for example to the photoacoustic sensor 100 in FIG. 1A through FIG. 1E. In contrast to FIG. 1A through FIG. 1E, the photoacoustic sensor 400 can comprise one or more connection elements 32, which can be designed to connect the photoacoustic sensor 400 mechanically and electrically to a printed circuit board (not shown). Two connection elements 32 are illustrated by way of example in the side view in FIG. 4. In further examples, the number of connection elements 32 can be chosen differently, in particular greater than two. In the example in FIG. 4, the connection elements 32 can be arranged on the top side of the third layer 12, wherein the right-hand connection element 32 can be electrically connected to the optical MEMS emitter 4 by way of a first electrical connection 34 and the left-hand connection element 32 can be electrically connected to the MEMS pressure pick-up 8 by way of a second electrical connection 34.

In one example, one or more of the electrical connections 34 can be fabricated on the basis of a plating technology. The electrical connections 34 can be arranged on a side surface of at least one of the layers of the photoacoustic sensor 400 and can run in a stepped fashion, i.e. can be designed to surmount steps that can be formed between layers stacked one over another. The plating technology used can be based for example on a lithographic process using a sprayable photomask. In this case, the routing and the plating over the affected steps can be effected in just one method action. As an alternative or in addition to the plating technology mentioned, in further examples, the electrical connections 34 can also be embodied in the form of electrical through connections that can run in the z-direction through the corresponding layers of the photoacoustic sensor 400. Depending on the material of the layers, said through connections can be for example TSVs (Through Silicon Vias) and/or TGVs (Through Glass Vias).

The photoacoustic sensor 400 in FIG. 4 can be directly connected to a printed circuit board (not shown) by way of the connection elements 32, for example by means of a soldering process. The photoacoustic sensor 400 can thus be a surface-mountable component or an SMD (Surface Mounted Device). As viewed in the z-direction, the layers of the photoacoustic sensor 400 can be substantially congruent. In other words, the photoacoustic sensor 400 can be a chip scale package (CSP).

Figure 5:
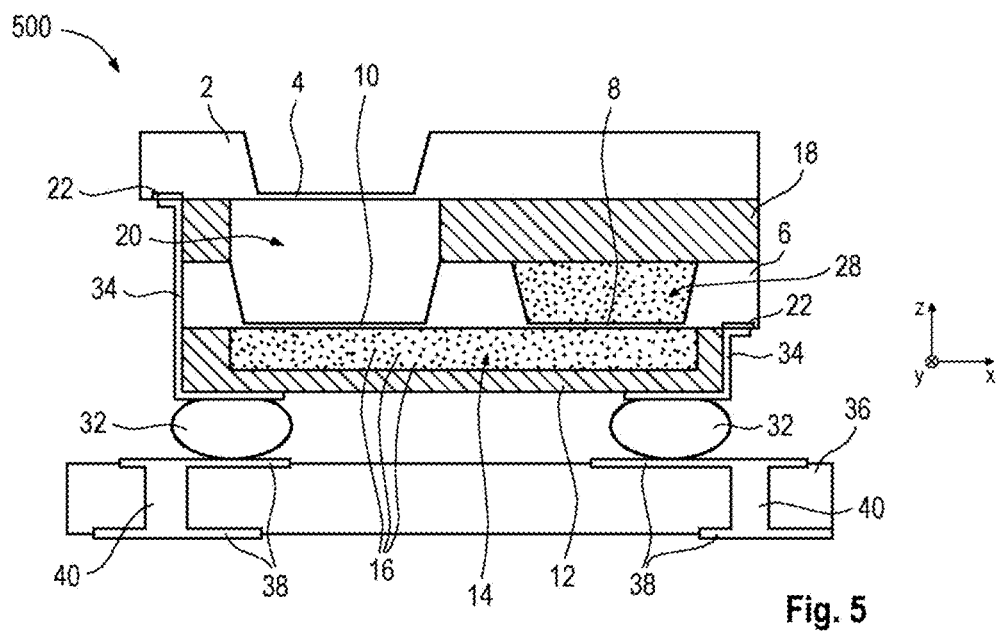
FIG. 5 schematically illustrates a cross-sectional side view of a photoacoustic sensor in accordance with the disclosure, according to another embodiment.

The photoacoustic sensor 500 in FIG. 5 can be at least partly similar to the photoacoustic sensors described above. By way of example, the photoacoustic sensor 500 can correspond to the photoacoustic sensor 400 from FIG. 4 in a flipped over state. In contrast to FIG. 4, the photoacoustic sensor 500 can be mounted on a printed circuit board 36. The printed circuit board 36 may or may not be regarded as part of the photoacoustic sensor 500. On the top side and/or underside of the printed circuit board 36, the printed circuit board 36 can have electrically conductive structures 38, which can be electrically connected to one another via through contacts 40.

Figure 6:
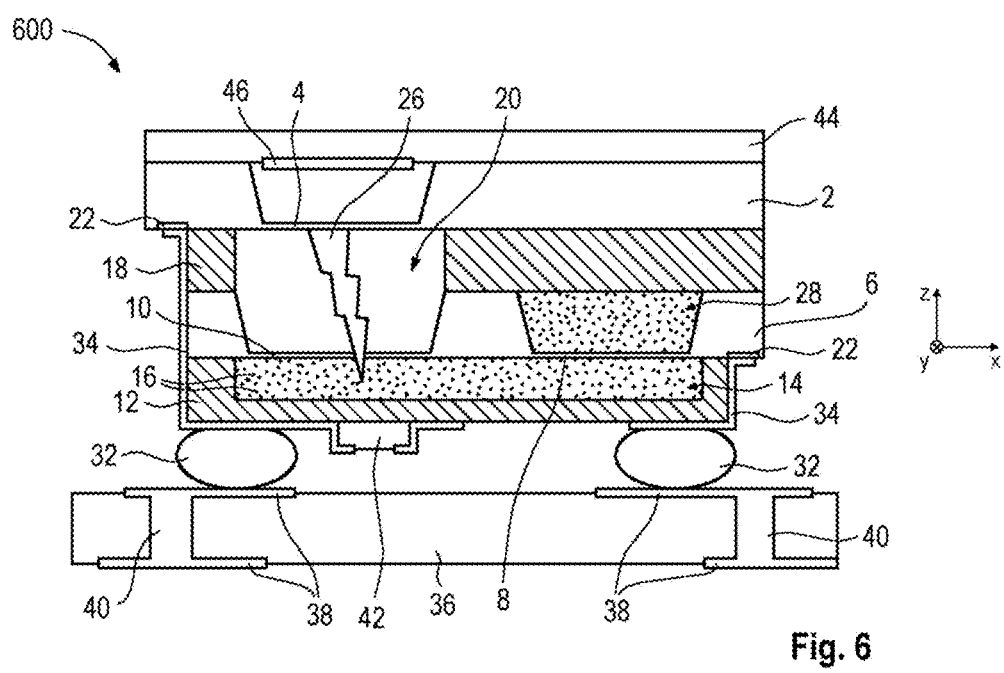
FIG. 6 schematically illustrates a cross-sectional side view of a photoacoustic sensor in accordance with the disclosure, according to another embodiment.

The photoacoustic sensor 600 in FIG. 6 can be at least partly similar to the photoacoustic sensors described above, for example to the photoacoustic sensor 500 in FIG. 5. In contrast to FIG. 5, the photoacoustic sensor 600 can comprise a photosensitive device 42 arranged on the third layer 12, which photosensitive device can comprise one or more photodiodes, for example. It is evident from FIG. 6 that the photosensitive device 42 can be arranged within the course of the optical path of the optical radiation 26. The photosensitive device 42 can be designed to monitor an output intensity or a performance of the optical MEMS emitter 4. Degradations of the optical MEMS emitter 4 that possibly occur over the lifetime thereof can be detected by measuring and evaluating the intensity of the emitted optical radiation 26 over time. A systematic deviation or a drift of the system can thereby be counteracted.

In contrast to FIG. 5, furthermore, the photoacoustic sensor 600 can comprise a further layer 44 stacked over the first layer 2. The layer 44 can be fabricated from at least one from a semiconductor material or a glass material and can be designed to protect the optical MEMS emitter 4. An optically reflective structure 46, for example in the form of a metallization, can be arranged on the underside of the layer 44. In the example in FIG. 6, the optical MEMS emitter 4 can be designed to transmit the optical radiation 26 predominantly in the negative z-direction. The reflective structure 46 can be designed to reflect optical radiation 26 of the optical MEMS emitter 4 that is transmitted in a direction deviating from said transmission direction. In the example in FIG. 6, in this case, in particular, optical radiation of the optical MEMS emitter 4 that is emitted in the positive z-direction can be reflected by the reflective structure 46. The reflective structure 46 can thus act as a mirror and amplify the intensity of the optical radiation in the negative z-direction.

Figure 7:
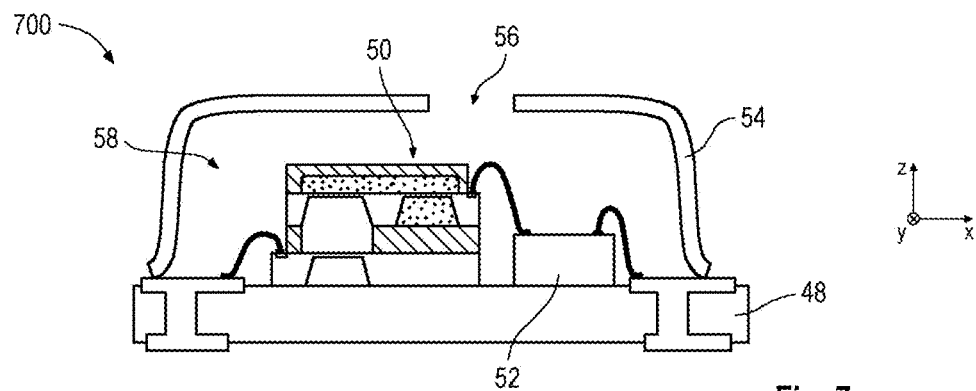
FIG. 7 schematically illustrates a cross-sectional side view of a photoacoustic sensor in accordance with the disclosure, according to another embodiment.

The photoacoustic sensor 700 in FIG. 7 can be at least partly similar to the photoacoustic sensors described above. The photoacoustic sensor 700 can comprise a carrier 48. In one example, the chip carrier 48 can be a laminate, in particular a laminate in the form of a printed circuit board-like organic multilayer substrate. In this respect, the chip carrier 48 can have for example properties similar to the printed circuit board 36 in FIG. 5. In a further example, the chip carrier 48 can be a ceramic chip carrier. In yet another example, the chip carrier 48 can be a leadframe, which can be fabricated from a metal and/or a metal alloy.

A sensor device 50 and a logic circuit 52 in the form of a semiconductor chip or a semiconductor package can be arranged on the top side of the chip carrier 48. In the example in FIG. 7, the sensor device 50 can be similar to the sensor 100 in FIG. 1A through FIG. 1E. In the example in FIG. 7, the sensor device 50, the logic circuit 52 and the carrier 48 can be electrically connected to one another by way of bond wires. Furthermore, a cover 54 with one or more sound openings 56 can be arranged over the top side of the chip carrier 48. The carrier 48 and the cover 54 can form a cavity 58, wherein the sensor device 50 and the logic circuit 52 can be arranged on a mounting surface of the carrier 48 in the cavity 58.

The cover 54 can be fabricated from a metal or a metal alloy, for example. The sound opening 56 can optionally be covered at least partly by a membrane (not shown). The membrane can be porous, for example, such that a gas flow or a gas exchange between the cavity 58 and the surroundings of the photoacoustic sensor 700 can be provided. The membrane can prevent dirt, contaminations, particles, etc. from penetrating into the cavity 58. The membrane can be fabricated from a metallic and/or organic material, for example.

Figure 8:
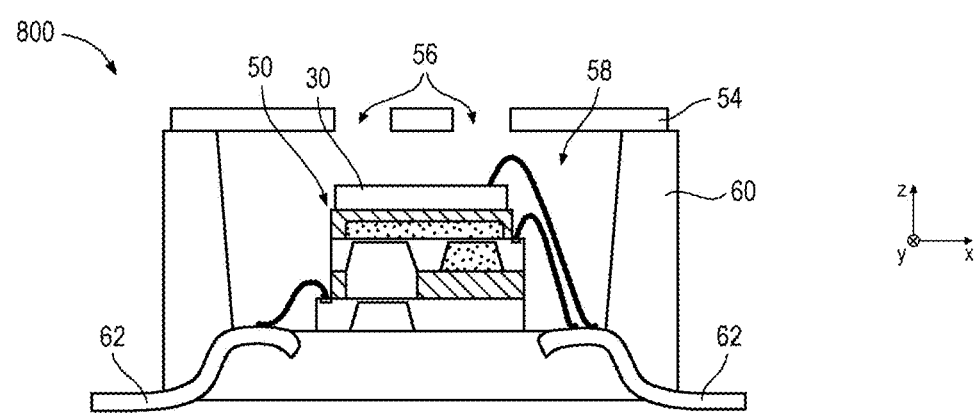
FIG. 8 schematically illustrates a cross-sectional side view of a photoacoustic sensor in accordance with the disclosure, according to another embodiment.

The photoacoustic sensor 800 in FIG. 8 can at least partly be similar to the photoacoustic sensor 700 in FIG. 7 and have the same functionalities. In contrast to FIG. 7, in the example in FIG. 8, a sensor device 50 can be arranged in a different type of housing. The housing in FIG. 8 can comprise a shell 60 fabricated from a mold compound and a cover 54 with one or more sound openings 56. The shell 60 and the cover 54 can form a cavity 58, wherein the sensor device 50 can be arranged on a base surface of the shell 60 in the cavity 58. In FIG. 8, the sensor device 50 can be similar to the photoacoustic sensor 300 in FIG. 3, for example. In this case, a logic circuit can be integrated in the layer 30 of the sensor device 50, as already described further above.

In the example in FIG. 8, the shell 60 and/or the cover 54 can be fabricated from a mold compound, for example. Mold compounds mentioned in this description can comprise at least one from an epoxy, a filled epoxy, a glass-fiber-filled epoxy, an imide, a thermoplastic, a thermosetting polymer, a polymer mixture. The mold compounds can be produced on the basis of one or more of the following techniques: compression molding, injection molding, powder molding, liquid molding, etc.

Electrical terminal conductors 62 can run through the shell 60, byway of which conductors the photoacoustic sensor 800 can be electrically connected for example to a printed circuit board (not shown). In the example in FIG. 8, the electronic components arranged in the housing can be electrically connected to the electrical terminal conductors 62 by way of bond wires. An electrical connection between a printed circuit board and the electronic components arranged in the housing can thus be provided by way of the electrical terminal conductors 62 and the bond wires.

Figure 9:
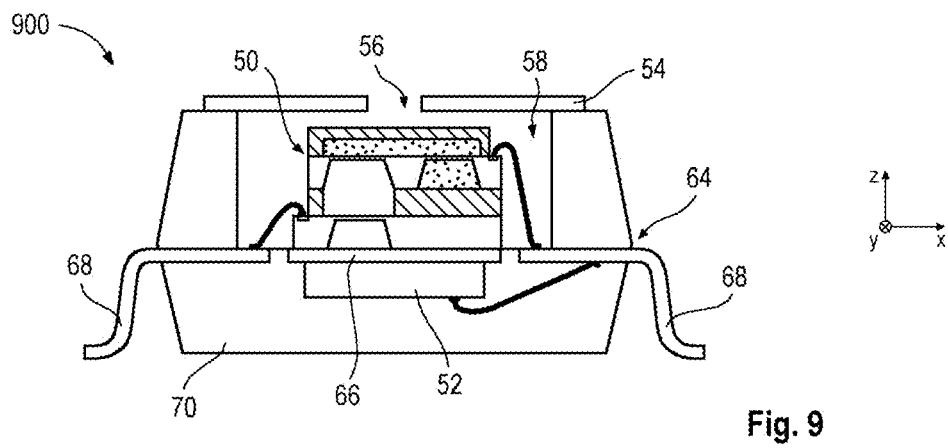
FIG. 9 schematically illustrates a cross-sectional side view of a photoacoustic sensor in accordance with the disclosure, according to another embodiment.

The photoacoustic sensor 900 in FIG. 9 can at least partly be similar to the photoacoustic sensors 700 and 800 in FIGS. 7 and 8 and have the same functionalities. In contrast to FIGS. 7 and 8, a sensor device 50 in FIG. 9 can be arranged in a different type of housing. In the example in FIG. 9, the sensor device 50 can be similar to the photoacoustic sensor 100 in FIG. 1A through FIG. 1E, for example.

The photoacoustic sensor 900 can comprise a leadframe 64 having one or more mounting surfaces (e.g., in the form of diepads 66) and one or more terminal conductors (leads or pins) 68. The terminal conductors 68 can be bent for example in wing-shaped fashion ("gull-wing"). In the example in FIG. 9, the sensor device 50 can be mounted on the top side of the diepad 66 and a logic circuit 52 can be mounted on an underside of the diepad 66. The photoacoustic sensor 900 can comprise an encapsulation material 70, which can be produced from a mold compound, for example. Furthermore, the photoacoustic sensor 900 can comprise a cover 54 with one or more sound openings 56, wherein the cover 54 can be fabricated from a mold compound, a metal and/or a metal alloy, for example. The logic circuit 52 can be embedded into the encapsulation material 70, whereby light-sensitive structures of the logic circuit 52 that are possibly present can be protected against light. The leadframe 64, the encapsulation material 70 and the cover 54 can form a cavity 58, wherein the sensor device 50 can be arranged in the cavity 58.

Figure 10:
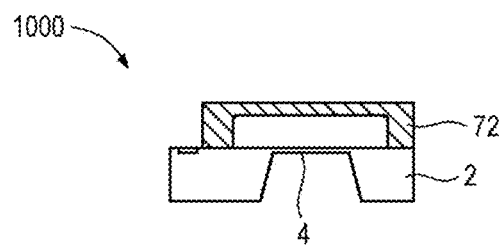
FIG. 10 schematically illustrates a cross-sectional side view of an emitter component in accordance with the disclosure.

The emitter component 1000 in FIG. 10 can comprise a layer 2 with an optical MEMS emitter 4. In this case, the layer 2 can be similar to the second layer 2 from FIG. 1A through FIG. 1E, for example. A cover 72 can be arranged over the layer 2, which cover can be fabricated from at least one from a glass material or a semiconductor material. In the example in FIG. 10, the cover 72 can have a depression. On the inner side of the cover 72, for example, an optically reflective structure in the form of a metallization, for example, can be present, as has already been described in association with FIG. 6. The cover 72 can be designed inter alia to protect the optical MEMS emitter 4 and in particular the movable structures thereof.

Figure 11:
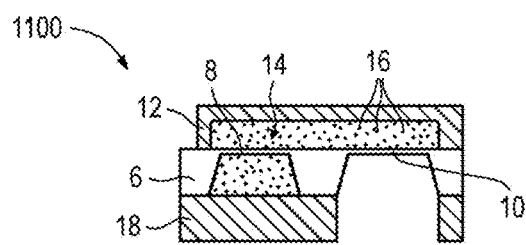
FIG. 11 schematically illustrates a cross-sectional side view of a pressure pick-up component in accordance with the disclosure.

The pressure pick-up component 1100 in FIG. 11 can comprise a layer 6 with a MEMS pressure pick-up 8 and an optically transparent window 10, wherein the MEMS pressure pick-up 8 and the optically transparent window 10 can be arranged offset laterally with respect to one another. In this case, the layer 6 can be similar to the second layer 6 in FIG. 1A through FIG. 1E, for example. A spacer layer 18 can be arranged on the underside of the layer 6 (in this respect, cf. FIG. 1A through FIG. 1E). Furthermore, a further layer 12 with a cavity 14 for a reference gas 16 can be mounted on the top side of the layer 6 (in this respect, cf. FIG. 1A through FIG. 1E).

Figure 12:
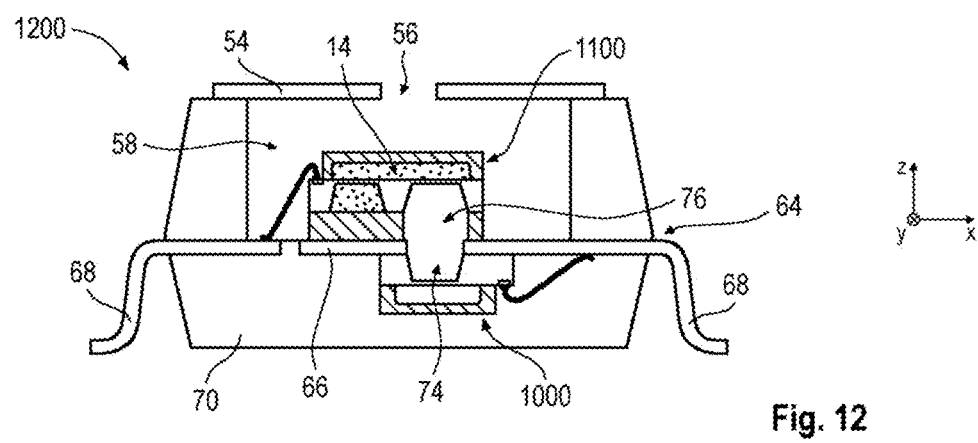
FIG. 12 schematically illustrates a cross-sectional side view of a photoacoustic sensor in accordance with the disclosure.

The photoacoustic sensor 1200 in FIG. 12 can be at least partly similar to the photoacoustic sensors described above. In particular, the housing of the photoacoustic sensor 1200 can be at least partly similar to the type of housing described in FIG. 9. The pressure pick-up component 1100 from FIG. 11 can be arranged on the upper mounting surface of the carrier or diepad 66, while the emitter component 1000 from FIG. 10 can be arranged on the lower mounting surface of the diepad 66. The two components 1000 and 1100 can thus be separated from one another by the diepad 66. The leadframe 64 or the diepad 66 can have an opening 74. Together with the cutouts of the components 1000 and 1100, the opening 74 can form a cavity 76, which can form a gas channel to surroundings or an ambient gas of the photoacoustic sensor 1200, as already described in association with previous examples. The components 1000 and 1100 can be arranged over the diepad 66 in such a way that the optical MEMS emitter 4 can transmit optical radiation along an optical path, wherein the optical path runs through the opening 74, the cavity 76, the optically transparent window 10 and the cavity 14 for the reference gas 16. Analogously to the previous examples, the MEMS pressure pick-up 8 in this case can be arranged outside the course of the optical path.

Figure 13:
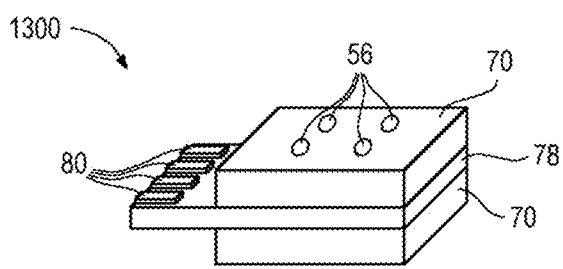
FIG. 13 schematically illustrates a perspective view of a photoacoustic sensor in accordance with the disclosure.

The photoacoustic sensor 1300 in FIG. 13 can be similar to the photoacoustic sensors 900 and 1200 in FIGS. 9 and 12, for example. In contrast to FIGS. 9 and 12, the carrier in FIG. 13 can be embodied in the form of a PCB-like substrate 78, on the top side and/or underside of which for example the components shown in FIGS. 9 and 12 can be arranged. In FIG. 13, these components need not necessarily be visible since they can be covered by one or more covers or encapsulation materials 70. One or more openings 56 can be formed in the encapsulation materials 70 and can provide a gas connection between the surroundings of the photoacoustic sensor 1300 and the interior thereof.

The substrate 78 can at least partly be left so that it is not covered by the encapsulation materials 70, and have one or more electrical terminals 80 on its top side and/or underside. Byway of the electrical terminals 80, the emitter and/or pressure pick-up components arranged within the encapsulation materials 70 can be electrically contacted from outside the photoacoustic sensor 1300. The photoacoustic sensor 1300 need not necessarily be a surface-mountable component. Rather, the photoacoustic sensor 1300 can be plugged into a socket (not shown) for example by that part of the substrate 78 which is not covered by the encapsulation materials 70. The socket can have in its interior electrical contact elements that can be electrically connected to the electrical terminals 80 during plugging in.

Figure 14:
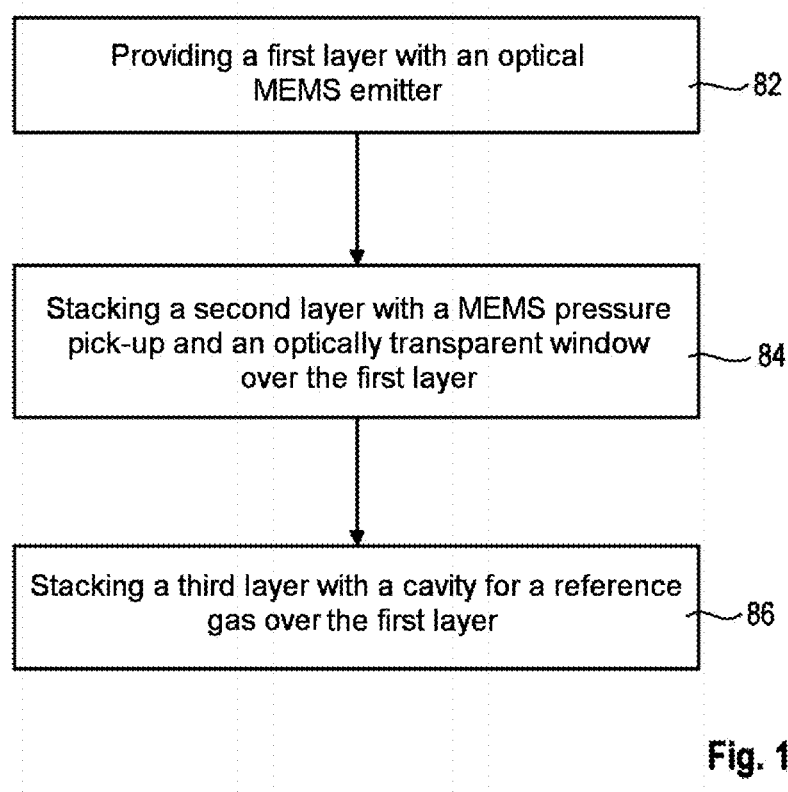
FIG. 14 shows a flow diagram of a method for producing a photoacoustic sensor in accordance with the disclosure.

The method in FIG. 14 is a method for producing a photoacoustic sensor in accordance with the disclosure. In this respect, the method can be read in conjunction with the previous examples. The method in FIG. 14 is presented in a general way in order to describe aspects of the disclosure qualitatively. The method can comprise further aspects, which are not shown and described in FIG. 14 for the sake of simplicity. By way of example, the method can be extended by one or more of the aspects described in conjunction with previous figures.

In 82, a first layer with an optical MEMS emitter can be provided. In 84, a second layer with a MEMS pressure pick-up and an optically transparent window can be stacked over the first layer, wherein the MEMS pressure pick-up and the optically transparent window are arranged offset laterally with respect to one another. In 86, a third layer with a cavity for a reference gas can be stacked over the second layer. The optical MEMS emitter can be designed to transmit optical radiation along an optical path, wherein the optical path runs through the optically transparent window and the cavity, and wherein the MEMS pressure pick-up can be arranged outside the course of the optical path. It should be noted that the method in FIG. 14 can comprise one or more further optional actions. By way of example, stacking the third layer over the second layer can comprise a wafer bonding action in which the cavity for the reference gas is formed in hermetically sealed fashion.

Photoacoustic sensors and associated production methods are explained on the basis of the examples below.

Example 1 is a photoacoustic sensor, comprising: a first layer with an optical MEMS emitter; a second layer stacked over the first layer with a MEMS pressure pick-up and an optically transparent window, wherein the MEMS pressure pick-up and the optically transparent window are arranged offset laterally with respect to one another; and a third layer stacked over the second layer with a cavity for a reference gas, wherein the optical MEMS emitter is designed to transmit optical radiation along an optical path, wherein the optical path runs through the optically transparent window and the cavity for the reference gas, and wherein the MEMS pressure pick-up is arranged outside the course of the optical path.

Example 2 is a photoacoustic sensor according to Example 1, wherein the second layer and the third layer are wafer bonded and form the cavity for the reference gas in hermetically sealed fashion.

Example 3 is a photoacoustic sensor according to Example 1 or 2, wherein at least one of the first layer or the second layer is fabricated from a semiconductor material.

Example 4 is a photoacoustic sensor according to any of the preceding examples, wherein the optically transparent window is fabricated from a semiconductor material of the second layer.

Example 5 is a photoacoustic sensor according to any of the preceding examples, wherein the optically transparent window comprises a bandpass filter structure designed to allow passage of at least optical radiation having a wavelength of an absorption band or an absorption line of the reference gas.

Example 6 is a photoacoustic sensor according to any of the preceding examples, wherein the third layer is fabricated from at least one from a semiconductor material or a glass material.

Example 7 is a photoacoustic sensor according to any of the preceding examples, wherein the second layer comprises an opening forming a gas channel to surroundings of the photoacoustic sensor.

Example 8 is a photoacoustic sensor according to any of the preceding examples, furthermore comprising: a spacer layer arranged between the first layer and the second layer with an opening, wherein the optical path runs through the opening of the spacer layer.

Example 9 is a photoacoustic sensor according to Example 8, wherein the opening of the spacer layer forms a part of the gas channel to the surroundings of the photoacoustic sensor.

Example 10 is a photoacoustic sensor according to any of the preceding examples, wherein the first layer furthermore comprises a logic circuit designed logically to process signals detected by the MEMS pressure pick-up and/or to control the optical MEMS emitter.

Example 11 is a photoacoustic sensor according to any of Examples 1 to 9, furthermore comprising: a further layer stacked over the first layer or over the third layer, wherein the further layer comprises a logic circuit designed logically to process signals detected by the MEMS pressure pick-up and/or to control the optical MEMS emitter.

Example 12 is a photoacoustic sensor according to any of the preceding examples, furthermore comprising: one or more connection elements designed to connect the photoacoustic sensor mechanically and electrically to a printed circuit board, wherein the connection elements are arranged on the third layer and are electrically connected to the optical MEMS emitter and the MEMS pressure pick-up by way of electrical connections.

Example 13 is a photoacoustic sensor according to Example 12, wherein the electrical connections are fabricated on the basis of a plating technology and are arranged on a side surface of at least one of the layers of the photoacoustic sensor.

Example 14 is a photoacoustic sensor according to any of the preceding examples, wherein the photoacoustic sensor is a surface-mountable component.

Example 15 is a photoacoustic sensor according to any of the preceding examples, wherein the photoacoustic sensor is a chip scale package.

Example 16 is a photoacoustic sensor according to any of the preceding examples, furthermore comprising: a photosensitive device arranged on the third layer, said photosensitive device being arranged within the course of the optical path and being designed to monitor an output intensity of the optical MEMS emitter.

Example 17 is a photoacoustic sensor according to any of the preceding examples, furthermore comprising: an optically reflective structure arranged over the first layer, wherein the optical MEMS emitter is designed to transmit optical radiation predominantly in a first direction, and wherein the reflective structure is designed to reflect optical radiation of the optical MEMS emitter that is transmitted in a direction deviating from the first direction.

Example 18 is a photoacoustic sensor according to any of the preceding examples, furthermore comprising: a printed circuit board-like substrate; and a cover with a sound opening, wherein the substrate and the cover form a cavity, wherein the layer stack with the first layer, the second layer and the third layer is arranged on a mounting surface of the substrate in the cavity.

Example 19 is a photoacoustic sensor according to any of Examples 1 to 17, furthermore comprising: a shell fabricated from a mold compound; and a cover with a sound opening, wherein the shell and the cover form a cavity, wherein the layer stack with the first layer, the second layer and the third layer is arranged on a base surface of the shell in the cavity.

Example 20 is a photoacoustic sensor according to any of Examples 1 to 18, furthermore comprising: a leadframe, wherein the layer stack with the first layer, the second layer and the third layer is mounted on a first mounting surface of the leadframe and a logic circuit is mounted on an opposite second mounting surface of the leadframe; an encapsulation material, wherein the logic circuit is embedded into the encapsulation material; and a cover with a sound opening, wherein the leadframe, the encapsulation material and the cover form a cavity and the layer stack is arranged in the cavity.

Example 21 is a photoacoustic sensor, comprising: an emitter component, comprising: a first layer with an optical MEMS emitter, and a cover arranged over the first layer; and a pressure pick-up component separate from the emitter component, comprising: a second layer with a MEMS pressure pick-up and an optically transparent window, wherein the MEMS pressure pick-up and the optically transparent window are arranged offset laterally with respect to one another, and a third layer stacked over the second layer with a cavity for a reference gas, wherein the optical MEMS emitter is designed to transmit optical radiation along an optical path, wherein the optical path runs through the optically transparent window and the cavity for the reference gas, and wherein the MEMS pressure pick-up is arranged outside the course of the optical path.

Example 22 is a photoacoustic sensor according to Example 21, furthermore comprising: a carrier, wherein the emitter component and the pressure pick-up component are mounted on opposite mounting surfaces of the carrier, wherein the carrier comprises an opening and the optical path runs through the opening of the carrier.

Example 23 is a photoacoustic sensor according to Example 21 or 22, furthermore comprising: an encapsulation material, wherein the emitter component is embedded into the encapsulation material; and a cover with a sound opening, wherein the chip carrier, the encapsulation material and the cover form a cavity and the pressure pick-up component is arranged in the cavity.

Example 24 is a method for producing a photoacoustic sensor, wherein the method comprises: providing a first layer with an optical MEMS emitter; stacking a second layer with a MEMS pressure pick-up and an optically transparent window over the first layer, wherein the MEMS pressure pick-up and the optically transparent window are arranged offset laterally with respect to one another; and stacking a third layer with a cavity for a reference gas over the second layer, wherein the optical MEMS emitter is designed to transmit optical radiation along an optical path, wherein the optical path runs through the optically transparent window and the cavity, and wherein the MEMS pressure pick-up is arranged outside the course of the optical path.

Example 25 is a method according to Example 24, wherein stacking the third layer over the second layer comprises a wafer bonding action in which the cavity for the reference gas is formed in hermetically sealed fashion.

Although specific embodiments have been illustrated and described herein, it is evident to the person skilled in the art that a multiplicity of alternative and/or equivalent implementations can replace the specific embodiments shown and described, without departing from the scope of the present disclosure. This application is intended to cover all adaptations or variants of the specific embodiments discussed herein. Therefore, the intention is for this disclosure to be restricted only by the claims and the equivalents thereof.

What is claimed is:

1. A photoacoustic sensor, comprising:
 a first layer with an optical MEMS emitter;
 a second layer stacked over the first layer with a MEMS pressure pick-up and an optically transparent window, wherein the MEMS pressure pick-up and the optically transparent window are arranged offset laterally with respect to one another; and a third layer stacked over the second layer with a cavity for a reference gas, wherein the optical MEMS emitter is configured to transmit optical radiation along an optical path, wherein the optical path runs through the optically transparent window and the cavity for the reference gas, and wherein the MEMS pressure pick-up is arranged outside a course of the optical path.

2. The photoacoustic sensor as claimed in claim 1, wherein the second layer and the third layer are wafer bonded and form the cavity for the reference gas in hermetically sealed fashion.

3. The photoacoustic sensor as claimed in claim 1, wherein at least one of the first layer or the second layer is fabricated from a semiconductor material.

4. The photoacoustic sensor as claimed in claim 1, wherein the optically transparent window is fabricated from a semiconductor material of the second layer.

5. The photoacoustic sensor as claimed in claim 1, wherein the optically transparent window comprises a bandpass filter structure configured to allow passage of at least optical radiation having a wavelength of an absorption band or an absorption line of the reference gas.

6. The photoacoustic sensor as claimed in claim 1, wherein the third layer is fabricated from at least one from a semiconductor material or a glass material.

7. The photoacoustic sensor as claimed in claim 1, wherein the second layer comprises an opening forming a gas channel to surroundings of the photoacoustic sensor.

8. The photoacoustic sensor as claimed in claim 1, further comprising:
a spacer layer arranged between the first layer and the second layer with an opening, wherein the optical path runs through the opening of the spacer layer.

9. The photoacoustic sensor as claimed in claim 8, wherein the opening of the spacer layer forms a part of the gas channel to the surroundings of the photoacoustic sensor.

10. The photoacoustic sensor as claimed in claim 1, wherein the first layer further comprises a logic circuit configured logically to process signals detected by the MEMS pressure pick-up and/or to control the optical MEMS emitter.

11. The photoacoustic sensor as claimed in claim 1, further comprising:
a further layer stacked over the first layer or over the third layer, wherein the further layer comprises a logic circuit configured logically to process signals detected by the MEMS pressure pick-up and/or to control the optical MEMS emitter.

12. The photoacoustic sensor as claimed in claim 1, further comprising:
one or more connection elements configured to connect the photoacoustic sensor mechanically and electrically to a printed circuit board, wherein the connection elements are arranged on the third layer and are electrically connected to the optical MEMS emitter and the MEMS pressure pick-up by way of electrical connections.

13. The photoacoustic sensor as claimed in claim 12, wherein the electrical connections are fabricated on the basis of a plating technology and are arranged on a side surface of at least one of the layers of the photoacoustic sensor.

14. The photoacoustic sensor as claimed in claim 1, wherein the photoacoustic sensor comprises a surface-mountable component.

15. The photoacoustic sensor as claimed in claim 1, wherein the photoacoustic sensor comprises a chip scale package.

16. The photoacoustic sensor as claimed in claim 1, further comprising:
a photosensitive device arranged on the third layer, said photosensitive device being arranged within the course of the optical path and being configured to monitor an output intensity of the optical MEMS emitter.

17. The photoacoustic sensor as claimed in claim 1, further comprising:
an optically reflective structure arranged over the first layer,
wherein the optical MEMS emitter is configured to transmit optical radiation predominantly in a first direction, and
wherein the reflective structure is configured to reflect optical radiation of the optical MEMS emitter that is transmitted in a direction deviating from the first direction.

18. The photoacoustic sensor as claimed in claim 1, further comprising:
a printed circuit board-like substrate; and
a cover with a sound opening,
wherein the substrate and the cover form a cavity, wherein the layer stack with the first layer, the second layer and the third layer is arranged on a mounting surface of the substrate in the cavity.

19. The photoacoustic sensor as claimed in claim 1, further comprising:
a shell fabricated from a mold compound; and
a cover with a sound opening,
wherein the shell and the cover form a cavity, wherein the layer stack with the first layer, the second layer and the third layer is arranged on a base surface of the shell in the cavity.

20. The photoacoustic sensor as claimed in claim 1, further comprising:
a leadframe, wherein the layer stack with the first layer, the second layer and the third layer is mounted on a first mounting surface of the leadframe and a logic circuit is mounted on an opposite second mounting surface of the leadframe;
an encapsulation material, wherein the logic circuit is embedded into the encapsulation material; and
a cover with a sound opening,
wherein the leadframe, the encapsulation material and the cover form a cavity and the layer stack is arranged in the cavity.

21. A photoacoustic sensor, comprising:
an emitter component, comprising:
a first layer with an optical MEMS emitter, and
a cover arranged over the first layer; and
a pressure pick-up component separate from the emitter component, comprising:
a second layer with a MEMS pressure pick-up and an optically transparent window, wherein the MEMS pressure pick-up and the optically transparent window are arranged offset laterally with respect to one another, and
a third layer stacked over the second layer with a cavity for a reference gas,
wherein the optical MEMS emitter is configured to transmit optical radiation along an optical path, wherein the optical path runs through the optically transparent window and the cavity for the reference gas, and wherein the MEMS pressure pick-up is arranged outside a course of the optical path.

22. The photoacoustic sensor as claimed in claim 21, further comprising:
a carrier, wherein the emitter component and the pressure pick-up component are mounted on opposite mounting surfaces of the carrier,
wherein the carrier comprises an opening and the optical path runs through the opening of the carrier.

23. The photoacoustic sensor as claimed in claim 22, further comprising:
an encapsulation material, wherein the emitter component is embedded into the encapsulation material; and
a cover with a sound opening,
wherein the carrier, the encapsulation material and the cover form a cavity and the pressure pick-up component is arranged in the cavity.

24. A method for producing a photoacoustic sensor, wherein the method comprises:
providing a first layer with an optical MEMS emitter;
stacking a second layer with a MEMS pressure pick-up and an optically transparent window over the first layer, wherein the MEMS pressure pick-up and the optically transparent window are arranged offset laterally with respect to one another; and
stacking a third layer with a cavity for a reference gas over the second layer,
wherein the optical MEMS emitter is configured to transmit optical radiation along an optical path, wherein the optical path runs through the optically transparent window and the cavity, and wherein the MEMS pressure pick-up is arranged outside a course of the optical path.

25. The method as claimed in claim 24, wherein stacking the third layer over the second layer comprises a wafer bonding action in which the cavity for the reference gas is formed in hermetically sealed fashion.

* * * * *